United States Patent

Lloyd

[15] 3,654,530

[45] Apr. 4, 1972

[54] INTEGRATED CLAMPING CIRCUIT

[72] Inventor: Robert H. F. Lloyd, Sunnyvale, Calif.

[73] Assignee: International Business Machines Corporation, Armonk, N.Y.

[22] Filed: June 22, 1970

[21] Appl. No.: 48,942

Related U.S. Application Data

[63] Continuation of Ser. No. 752,348, Aug. 13, 1968, abandoned.

[52] U.S. Cl. ..........................317/235 R, 307/237, 307/303, 317/235 D, 317/235 Z

[51] Int. Cl. .........................................................H01l 19/00

[58] Field of Search...................317/235; 307/213, 237, 303

[56] References Cited

UNITED STATES PATENTS

| | | | |
|---|---|---|---|
| 3,211,972 | 10/1965 | Kilby et al. | 317/235 |
| 3,488,564 | 1/1970 | Crafts | 317/235 |
| 3,417,260 | 12/1968 | Foster | 317/235 |
| 3,463,975 | 8/1969 | Biard | 317/235 |
| 3,218,613 | 11/1965 | Gribble | 317/235 |

OTHER PUBLICATIONS

IBM Tech Discl Bull " Semiconductor Resistor" by Gates, Vol. 8, No. 12 5/66 pages 1849–1850

IBM Tech Discl Bull " Nonlinear REsistor for Collector Clamping" by Cavaliere Vol 9, N3, 8/66 pages 828–829

IBM Tech Discl Bull " Resistor–Transistor Clamp" by Wu Vol. 10, No. 7, 12/67 page 1038

Electronics, " Integrated–Circuit Oscillator" By Yanai et al., Dec. 13, 1963 page 40.

*Primary Examiner*—Jerry D. Craig
*Attorney*—Fraser and Bogucki

[57] ABSTRACT

An integrated clamping circuit is provided in which the bulk collector resistance of a transistor is coupled to the base contact by a second collector contact to bias the collector-base junction in response to a potential difference between the base and main collector contacts. The level of collector-base junction bias is determined in part by the size of the auxiliary collector contact and its location relative to a heavily doped buried layer in the collector. The biased transistor conducts in a manner so as to clamp the voltage at the output terminal of an associated electrical device for load current above a threshold value.

2 Claims, 4 Drawing Figures

Patented April 4, 1972

3,654,530

INVENTOR
ROBERT H. F. LLOYD

BY *Fraser and Bogucki*

ATTORNEYS

INTEGRATED CLAMPING CIRCUIT

CROSS-REFERENCE TO RELATED APPLICATION

This application is a continuation of Ser. No. 752,348, Robert H. F. Lloyd, INTEGRATED CLAMPING CIRCUIT, filed Aug. 13, 1968 and now abandoned.

BACKGROUND OF THE INVENTION

1. Field of the Invention

The present invention relates to semiconductor devices, and more particularly to integrated circuits designed to perform a particular electrical function or functions within a limited amount of physical space.

2. Description of the Prior Art

The increasing complexity of computer and other electronic systems coupled with a strong emphasis on miniaturization has dictated the use of circuit components or arrangements which occupy a limited amount of physical space within the system, yet perform the necessary electronic functions. One solution to the problem has been the use of integrated circuit techniques in which entire circuits can be fabricated from a single crystal of semiconductor material using diffusion or other well-known processes. The completed circuit provides an integral unit of considerable simplicity and relatively small size, which unit may be readily incorporated in a larger system and removed for maintenance or repair as required.

Presently known integrated circuits suffer from a number of disadvantages, particularly in view of ever increasing demands for miniaturization. One problem lies in the relatively large number of different semiconductor regions within the circuit which may be required for example to provide isolation between closely grouped independent circuit elements, or to provide resistances of selected value. Such additional regions may sufficiently increase the size of an integrated circuit so as to render it impractical for many applications.

Many electronic arrangements, such as current mode logic circuits by way of example, employ a considerable number of clamping circuits which are coupled to various circuit devices as load resistors. The clamping circuits, which frequently comprise transistors, provide a current path of controlled conductivity for the load current of associated devices so as to clamp the output voltage of the device when the load current exceeds a threshold value. Each clamping circuit may be fabricated as an integrated circuit including a transistor and discrete resistors external to the transistor and discrete resistors external to the transistor for biasing the emitter-base and collector-base junctions to provide the desired conductivity within the transistor. Resistors of intermediate value comprise only a small part of the total integrated circuit bulk and accordingly do not pose any significant problems. Resistors of relatively small value such as those typically used to bias the collector-base junction of the transistor however, may be larger in size than the transistor itself, and as such increase the overall circuit bulk so as to make such circuits impractical for large scale use. The considerable volume required by such resistors is due in part to excessive width which may be required to produce the desired low ohmic value and an overall large size generally required in order to reduce the effects of the variations in contact resistance to a point where a reasonable tolerance on the resistance can be maintained.

BRIEF SUMMARY OF THE INVENTION

In brief, the present invention provides an integrated circuit in which a resistor of relatively small value and coupled to the collector of a transistor adjacent the collector-base junction thereof is provided by using the bulk resistance of the collector region rather than a discrete resistor external to the transistor. A second or auxiliary collector contact spaced apart from the main collector contact of the transistor is provided to couple the resistor as desired, and the resistor may be given a desired value by appropriate selection of the size and location of the second collector contact.

The above technique is ideally utilized in a clamping circuit where a resistance of relatively small value is typically required in order to properly bias the collector-base junction of a transistor. The transistor is coupled between the output terminal of an electrical device which is to be clamped and a reference terminal such as the positive terminal of a power supply via the emitter and collector contacts thereof, the collector contact being made relatively large in area in order to minimize the internal collector resistance. A discrete resistor which is external to the transistor and which may be conveniently fabricated as an integral part of the clamping circuit is coupled between the emitter and base contacts of the transistor to bias the emitter-base junction in accordance with a potential difference between the emitter and collector contacts. The resistance of the collector between a region adjacent the collector-base junction and a second collector contact coupled to the base contact provides the desired biasing of the collector-base junction.

In accordance with particular aspects of the invention the performance of the circuit is greatly enhanced by the presence of a buried subcollector layer within the collector region of the transistor. The buried layer which is preferably of relatively high conductivity material provides a low impedance current path from the region adjacent the collector-base junction to regions adjacent the first and second collector contacts. This feature combined with the relatively large sized first collector contact even further minimizes the internal collector resistance. The buried subcollector layer moreover makes possible the use of the resulting bulk collector resistance to achieve the relatively low values of collector-base biasing resistance which are typically required. The collector-base biasing resistance may be adjusted in value by varying the size of the second collector contact and by varying the location of this contact relative to the buried layer.

BRIEF DESCRIPTION OF THE DRAWINGS

The foregoing and other objects, features and advantages will be apparent from the following more particular description of the preferred embodiment of the invention, as illustrated by the accompanying drawings.

DETAILED DESCRIPTION

Figure 1:
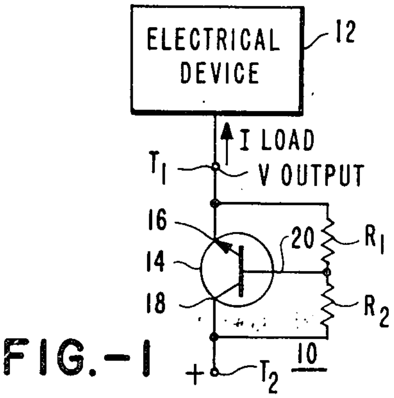
FIG. 1 is a partial schematic diagram useful in describing the operation of a transistor clamping circuit.

FIG. 1 illustrates a transistor clamping circuit 10 coupled between an output terminal $T_1$ of an electrical device 12 and a second terminal $T_2$ at a reference voltage point such as the positive terminal of a power supply. The electrical device 12 may comprise any appropriate logical or other electronic circuit element or component having a terminal which is to be clamped. In a current mode logic circuit, for example, logical OR circuits typically comprise opposite pairs of transistors having their emitter leads coupled to the negative terminal of a power supply, their base leads respectively coupled to a reference supply and a source of information bearing signals, and their collector leads coupled to the positive terminal of the power supply through a load resistor. To clamp the collector voltage for load resistor current above a predetermined threshold value, a clamping circuit such as the circuit 10 illustrated in FIG. 1 is used as the load resistor, the output terminal $T_1$ thereof being coupled to all collector leads of the transistors comprising the OR function and the second terminal $T_2$ being coupled to the positive terminal of the power supply.

In the present instance a load current $I_{load}$ is assumed to flow through the output terminal $T_1$ and into the electrical device 12, and the output voltage $V_{output}$ at the terminal $T_1$ is to be clamped or limited for values of $I_{load}$ above a predetermined threshold value. The output voltage is chosen to be clamped in this instance for convenience of illustration. The voltage at other terminals within the electrical device 12 may be clamped using the circuit 10, and the current through the clumped terminal may flow in either direction as appropriate.

In the arrangement of FIG. 1 it is assumed that the load current $I_{load}$ flows from the second terminal $T_2$ through the output terminal $T_1$ and into the device 12. A current path of controlled conductivity is provided by an NPN-transistor 14 having an emitter electrode 16 coupled to the output terminal $T_1$ and a collector electrode 18 coupled to the second terminal $T_2$. Alternatively, the transistor 14 may be of the PNP-type if desired, and the emitter and base electrodes 16 and 18 thereof may be coupled to the terminals $T_1$ and $T_2$ as shown, or reversed depending upon the direction in which $I_{load}$ is to flow.

An emitter-base biasing resistor $R_1$ is coupled between the emitter electrode 16 and a base electrode 20 of the transistor 14, and a collector-base biasing resistor $R_2$ is coupled between the collector electrode 18 and the base electrode 20. If a potential difference is provided between the terminal $T_1$ and $T_2$, such difference also appears across the resistors $R_1$ and $R_2$ and is divided in accordance with the relative values of the two resistors. The resulting voltage drop across the resistor $R_1$ forward-biases the emitter-base junction of the transistor 14, while the voltage drop across the resistor $R_2$ reverse-biases the collector-base junction of the transistor 14.

Figure 2:
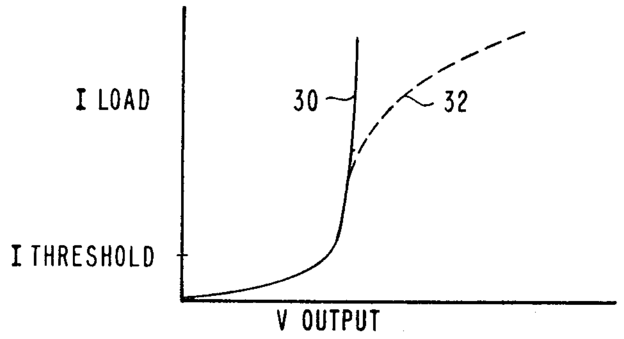
FIG. 2 is a diagrammatic plot of the characteristics provided by the clamping circuit of FIG. 1.

The operating characteristics provided by the clamping circuit 10 of FIg. 1 are illustrated in FIG. 2 which is a plot of the load current $I_{load}$ as a function of the output $V_{output}$. As shown by the solid line curve 30 the output voltage increases in approximately straight-line fashion for increasing values of the load current up to a threshold value $I_{threshold}$. For increasing values of the load current above the threshold value however, the resulting increases in the output voltage are slight, thereby providing the desired voltage clamping action. If the values of the biasing resistors $R_1$ and $R_2$ are properly chosen, the resulting characteristics of the clamping circuit 10 closely follow the solid-line curve 30 of FIG. 2 so as to increase the conduction of the transistor 14 for ever increasing values of the load current without driving it into saturation.

As a practical matter the idealized curve 30 of FIG. 2 may be difficult to approximate depending in part upon the properties of the transistor 14 which is used in the clamping circuit 10. The internal collector resistance $R_3$ (not shown in FIG. 1) which is the resistance between the collector-base junction of the transistor and the collector contact may be sufficiently large to cause undesirable clamping characteristics, such as shown by the dashed line curve 32 of FIG. 2. The value of $R_3$ depends primarily upon transistor design. For relatively small values of $R_3$ the idealized curve 30 of FIG. 2 is easily approximated. For relatively large values of $R_3$ however, the output voltage increases when the transistor enters its saturation region. At this point the internal collector resistance $R_3$ becomes the parasitic saturation resistance of the transistor, and the transistor is driven into saturation, rendering the clamping circuit ineffective and causing a reduction in circuit switching speed.

Several considerations are thus apparent in providing an effective transistor clamping circuit. The internal collector resistance $R_3$ of the transistor should be as small as possible to provide the capability of handling very large currents. Moreover, the collector-base biasing resistor $R_2$ must typically be relatively low in value compared to the value of the emitter-base biasing resistor $R_1$ to provide a small potential difference between the collector and base terminals and a large potential difference between the emitter and base terminals. Depending upon the parameters of the transistor 14 used in the clamping circuit 10, the resistor $R_2$ may typically have a maximum value of 30 ohms and is preferably on the order of 10–20 ohms, while the resistor $R_1$ may have a value on the order of 100 ohms or more. The tolerance of the resistor $R_2$ is not particularly critical and may be on the order of ± 40 percent or more for some applications. The important consideration is that the resistor $R_2$ assume a value within the range required for successful operation of the clamping circuit 10.

For certain applications where space is not a particularly important consideration, the resistors $R_1$ and $R_2$ may comprise conventional resistors of carbon composition or other appropriate form which are external to the transistor 14 and which are coupled thereto in appropriate fashion. In other applications where space is a very important consideration, the clamping circuit 10 is ideally fabricated as a single monolithic structure or integrated circuit to minimize space requirements and to facilitate the manufacture of the entire logic circuit or major portions thereof in compatible form.

One approach is to fabricate both of the resistors $R_1$ and $R_2$ as discrete resistors external to the transistor structure. The use of standard diffused resistor techniques however results in a resistor $R_2$ of very large size because of the small value required therefor. The large resistor size is dictated by the low ohmic value thereof and the requirement for large size to reduce the effects of the variation in contact resistance to a point where a reasonable tolerance on the resistor can be maintained. In accordance with the present invention the overall size of the integrated clamping circuit is greatly reduced by using the bulk collector resistance to form $R_2$, such an arrangement being illustrated in FIGS. 3 and 4.

Figure 4:
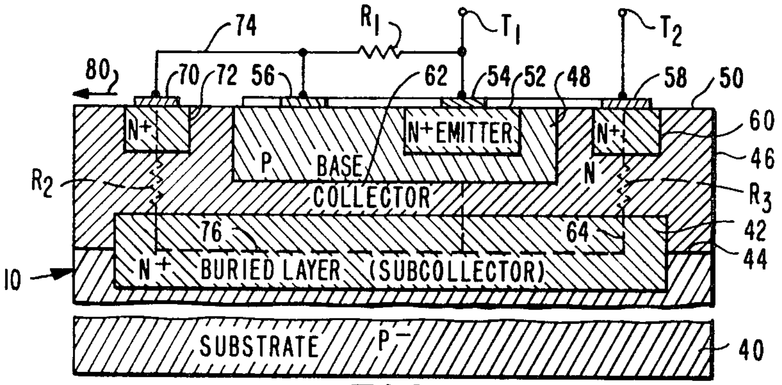
FIG. 4 is a sectional view of the integrated clamping circuit of FIG. 3, taken along the line 4—4 thereof and illustrating the external connections of the various circuit elements.
Figure 3:
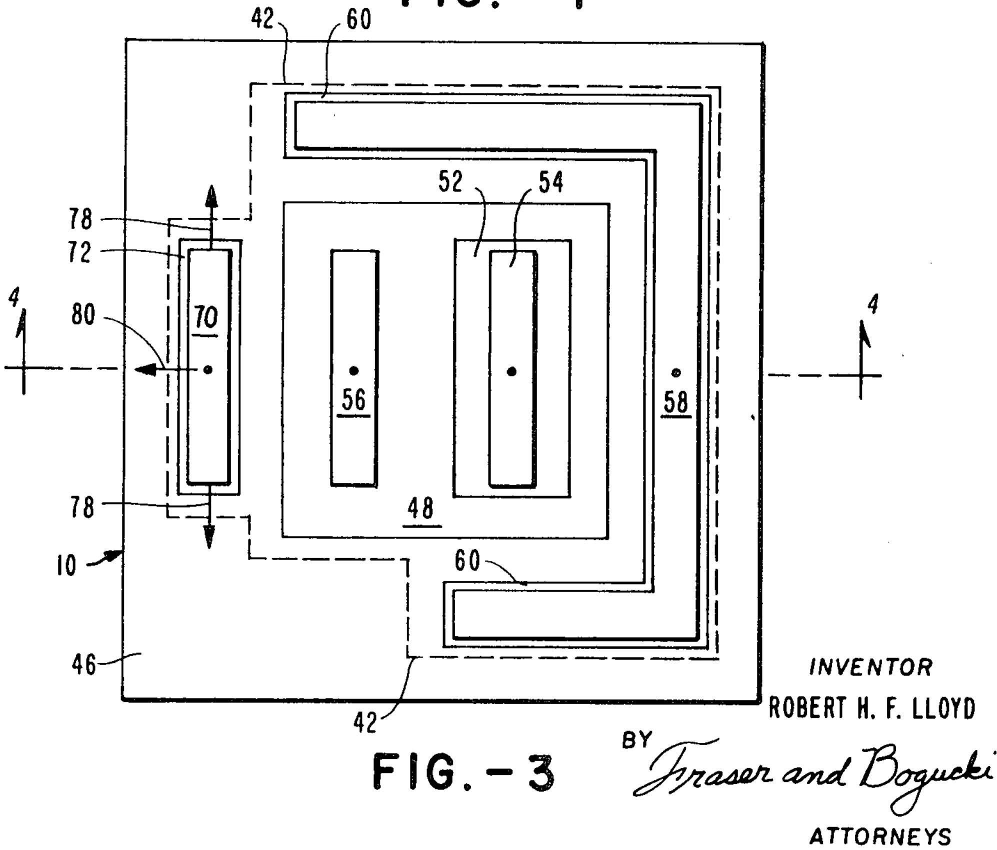
FIG. 3 is a plan view of an integrated clamping circuit in accordance with the invention.

The circuit 10 of FIGS. 3 and 4 is readily fabricated from a single crystal of relatively lightly doped material of P-type semiconductivity, the bottom portion of which forms a substrate element or region 40. By appropriate diffusion techniques a buried subcollector layer 42 of relatively heavily doped material of N-type semiconductivity is partially inset into the substrate region 40 from the upper major surface 44 thereof. A relatively thin layer 46 of N-type semiconductivity material is then epitaxially grown so as to extend over the buried layer 42 and the upper surface 44 of the substrate 40. The epitaxial layer 46 and the buried layer 42 together form a collector element or region. The thickness of the epitaxial layer 46 is greatly exaggerated in FIG. 4 for purposes of illustration.

A base element or region 48 of P-type semiconductivity material is inset from the upper major surface 50 of the epitaxial layer 46 opposite the buried layer 42 by diffusion or other appropriate techniques. In similar fashion an emitter element or region 52 of relatively heavily doped material of N-type semiconductivity is formed so as to be inset from the upper surface 50 and within the base 48. The transistor is completed by the addition of an ohmic emitter contact 54 which is formed with the emitter 52, an ohmic base contact 56 which is formed with the base 48, and a first or main ohmic collector contact 58 formed with the epitaxial layer 46. A relatively small element or region 60 of relatively heavily doped material of N-type semiconductivity may be inset into the buried layer 46 from the upper major surface 50 thereof immediately below the collector contact 58, if desired. The heavily doped region 60 reduces the internal collector resistance $R_3$, and in particular facilitates the formation of the ohmic collector contact 58 where contact materials such as aluminum are used.

The collector current which flows between the collector contact 58 and the collector-base junction 62 generally follows a path represented by the dashed line 64 in FIG. 4. The region 60 and the buried layer 42 are heavily doped, and accordingly introduce little resistance into the path 64. Similarly, the portion of the epitaxial layer 46 which extends between the buried layer 42 and the collector-base junction 62 introduces little resistance into the path 64 despite its high resistivity, since it is relatively thin. Accordingly, a substantial portion of the internal collector resistance $R_3$ is comprised of that portion of the epitaxial layer 46 extending between the region 60 and the buried subcollector layer 42. The presence of the heavily doped buried layer 42 greatly minimizes the value of $R_3$. The value of $R_3$ is even further reduced by the use of a collector contact 58 having a relatively large area. The portion of the epitaxial layer 46 extending between the collector contact 58 and the buried layer 42 thereby functions as many resistors in parallel.

The external connections of the integrated clamping circuit 10 are shown in FIG. 4, but have been omitted from FIG. 3 for simplicity. The emitter and collector contacts 54 and 58 are respectively coupled to the output terminal $T_1$ and the reference terminal $T_2$. The emitter-base biasing resistor $R_1$ is coupled between the emitter contact 54 and the base contact 56, and is conveniently illustrated in schematic form in FIG. 3. In actual practice the resistor $R_1$ is preferably fabricated as a part of the integrated clamping circuit 10 using diffusion or other appropriate techniques.

In accordance with the invention the collector-base biasing resistor $R_2$ is derived from the epitaxial layer 46 and the buried layer 42. A portion of the upper major surface 50 of the epitaxial layer 46 removed from the first collector contact 58 is formed with a second or auxiliary ohmic collector contact 70 of considerably smaller area than the first collector contact 58. A relatively heavily doped element or region 72 of N-type semiconductivity material is inset from the upper major surface 50 of the epitaxial collector layer 46 immediately below the second collector contact 70 to facilitate the information of the contact 70. The second collector contact 70 is coupled to the base contact 56 by a lead 74 which may comprise a shorting strap or other appropriate means of integrated circuit contact interconnection. The collector-base biasing current generally follows a path represented by the dashed line 76 in FIG. 4. Again the region 72 and the buried subcollector layer 42 introduce little resistance into such path because of their relatively high doping level, and that portion of the epitaxial layer 46 which extends therebetween defines the major portion of $R_2$.

The use of the bulk collector resistance to provide $R_2$ is facilitated by the presence of the buried layer 42. By providing a highly conductive path through substantially all of the collector region except for that portion of the epitaxial layer 46 between the buried layer 42 and the heavily doped region 72, a relatively low resistance on the order of that required for most applications of $R_2$ is thereby provided. By carefully controlling the thickness and doping of the epitaxial layer 46 during manufacture desired values of $R_2$ having reasonable tolerances are easily achieved.

The value of $R_2$ for an integrated circuit 10 having epitaxial and buried layers 46 and 42 of given size and doping levels may be further adjusted by varying the area of the second collector contact 70, or its location relative to the buried layer 42 and collector-base junction 62, or both. For a given location of the contact 70, the value of $R_2$ may be respectively increased or decreased by decreasing or increasing the area of the contact. Referring to FIG. 3 by way of example, the value of $R_2$ can be decreased by extending the length of the contact 70 in the directions shown by the arrows 78. For a second collector contact 70 of given size, the value of $R_2$ may be respectively increased or decreased by relocating the contact 70 further away from or closer to the buried layer 42. Again referring to FIG. 3 by way of example, the value of $R_2$ can be increased by moving the contact 70 in direction shown by the arrow 80 to relocate the contact further away from the buried layer 42.

The arrangement shown in FIGS. 3 and 4 is one example of an integrated clamping circuit in accordance with the invention, and it will be understood that other appropriate configurations and methods of fabrication are possible. Moreover, the technique of using the bulk collector resistance to provide a collector coupled resistor of relatively small value may be utilized in the integrated circuit arrangements other than that of a clamping circuit where appropriate.

Thus, while the invention has been particularly shown and described with reference to a preferred embodiment thereof, it will be understood by those skilled in the art that various changes in form and details may be made therein without departing from the spirit and scope of the invention.

What is claimed is:

1. A clamping circuit comprising the combination of a pair of terminals, a base element, an emitter element in emitter-base junction forming contact with the base element, a collector element in collector-base junction forming contact with the base element, means coupling one or the pair of terminals to a surface portion of the emitter element, means coupling the other of the pair of terminals to a first surface portion of the collector element, resistor means coupled between the surface portion of the emitter element and a surface portion of the base element and responsive to a potential difference between the pair of terminals to bias the emitter-base junction, and means coupling the surface portion of the base element to a second surface portion of the collector element, that part of the collector element which extends between the second surface portion thereof and the collector-base junction being responsive to a potential difference between the pair of terminals to bias the collector-base junction, the collector element includes a buried layer of material of relatively high semiconductivity extending from a region adjacent the collector-base junction to regions adjacent the first and second surface portions of the collector element, the means coupling the other of the pair of terminals to a first surface portion of the collector element includes a main collector contact disposed on the first surface portion of the collector element, and the means coupling the surface portion of the base element to a second surface portion of the collector element includes an auxiliary collector contact disposed on the second surface portion of the collector element, said main collector contact being larger in size than said auxiliary collector contact.

2. A clamping circuit in accordance with claim 1, wherein that portion of the collector element which extends between the buried layer and the auxiliary collector contact defines the major portion of a collector-base junction biasing resistor, and the size of the auxiliary collector contact and the location thereof relative to the buried layer are chosen to provide the collector-base junction biasing resistor with a selected value.

* * * * *